United States Patent [19]
Goldstein

[11] 3,982,202
[45] Sept. 21, 1976

[54] STABILIZATION OF LASER OUTPUT
[75] Inventor: Thomas Goldstein, Woodbridge, N.J.
[73] Assignee: Bell Telephone Laboratories, Incorporated, Murray Hill, N.J.
[22] Filed: July 2, 1975
[21] Appl. No.: 592,370

[52] U.S. Cl. .............................. 331/94.5 S
[51] Int. Cl.² ............................ H01S 3/13
[58] Field of Search ..................... 331/94.5

[56] References Cited
UNITED STATES PATENTS
3,586,997   6/1971   Kinsel ............................ 331/94.5 S
3,713,042   1/1973   Kinsel ............................ 331/94.5 M Primary Examiner—William L. Sikes
Attorney, Agent, or Firm—L. C. Canepa

[57] ABSTRACT

Signals derived from a moving shuttle table are utilized to trigger a cavity-dumped YAG laser whose output pulses are directed to machine successive lines of an iron oxide film in a spot-by-spot manner. Machining of the film to form a high-quality reticle requires that the amplitude of the laser output pulses be maintained relatively constant even in the presence of mechanical vibrations and electrical noise which ordinarily tend to produce large fluctuations in the output power of the laser. This is achieved by interposing a phase-locked loop between the output of the shuttle table and the input of the laser. In addition, the loop enhances the machining operation by providing a capability to easily multiply the repetition rate of the pulses derived from the table.

6 Claims, 2 Drawing Figures

STABILIZATION OF LASER OUTPUT

BACKGROUND OF THE INVENTION

This invention relates to controlling the output of a laser and, more particularly, to a phase-locked loop circuit utilized to drive a pulse-operated laser.

Various ways of obtaining a uniformly spaced train of pulses from a continuously pumped laser are known. One of these techniques, designated cavity dumping, has been utilized, for example, to operate a Nd:YAG laser to achieve pulse repetition rates of from 125 kilohertz up to several megahertz. Cavity dumping of Nd:YAG lasers is described by R. B. Chesler and D. Maydan in *Journal of Applied Physics*, Vol. 42, No. 3, pages 1028–1034, Mar. 1, 1971.

Cavity-dumped Nd:YAG lasers are used in a number of applications of practical importance. One such application is a system for making reticles for integrated circuit fabrication. In this system the pulsed laser is utilized to selectively machine an iron oxide film to form a pattern composed of transparent and opaque regions.

To achieve high-quality reticles in a laser machining system it is essential that the output pulses provided by the laser be characterized by a high degree of amplitude stability and uniformity. To achieve this output condition it is necessary that the electrical control signals applied to drive the laser be exactly or nearly exactly spaced apart in time.

It has been found, however, that randomly occurring vibrations and noise in an actual machining system cause the control signals applied to the laser to deviate from perfect periodicity. Without some effective means for correcting this condition the machining system will not function to provide acceptable reticles.

Moreover, it has been found that the frequency of the control signals developed in the machining system for driving the laser is, as a practical matter, insufficiently high to meet various operating criteria established for the system.

Thus the need arose for a instrumentality that would be capable of processing the laser driving signals developed in the machining system to achieve a uniform spacing of these signals under actual working conditions. In addition, the need arose to multiply the frequency of these driving signals by a specified integral factor.

SUMMARY OF THE INVENTION

Accordingly, an object of the present invention is to control the output of a pulsed laser to meet specified stability and frequency criteria.

More particularly, an object of this invention is to process control signals developed in a machining system to impart specified characteristics thereto before utilizing the signals to drive a cavity-dumped laser included in the system.

Briefly, these and other objects of the present invention are realized in a specific illustrative embodiment thereof in which electrical control signals characterized by occasional deviations from periodicity are applied via a phase-locked-loop circuit to drive a cavity-dumped Nd:YAG laser. The circuit performs filtering and frequency multiplication functions whereby the driving signals applied to the laser exhibit uniform spacing and a frequency that is an integral multiple of the control signals. By this means the output of the laser is controlled to have excellent amplitude stability.

BRIEF DESCRIPTION OF THE DRAWING

A complete understanding of the present invention and of the above and other objects may be gained from a consideration of the following detailed description presented hereinbelow in connection with the accompanying drawing in which.

DETAILED DESCRIPTION

Figure 1:
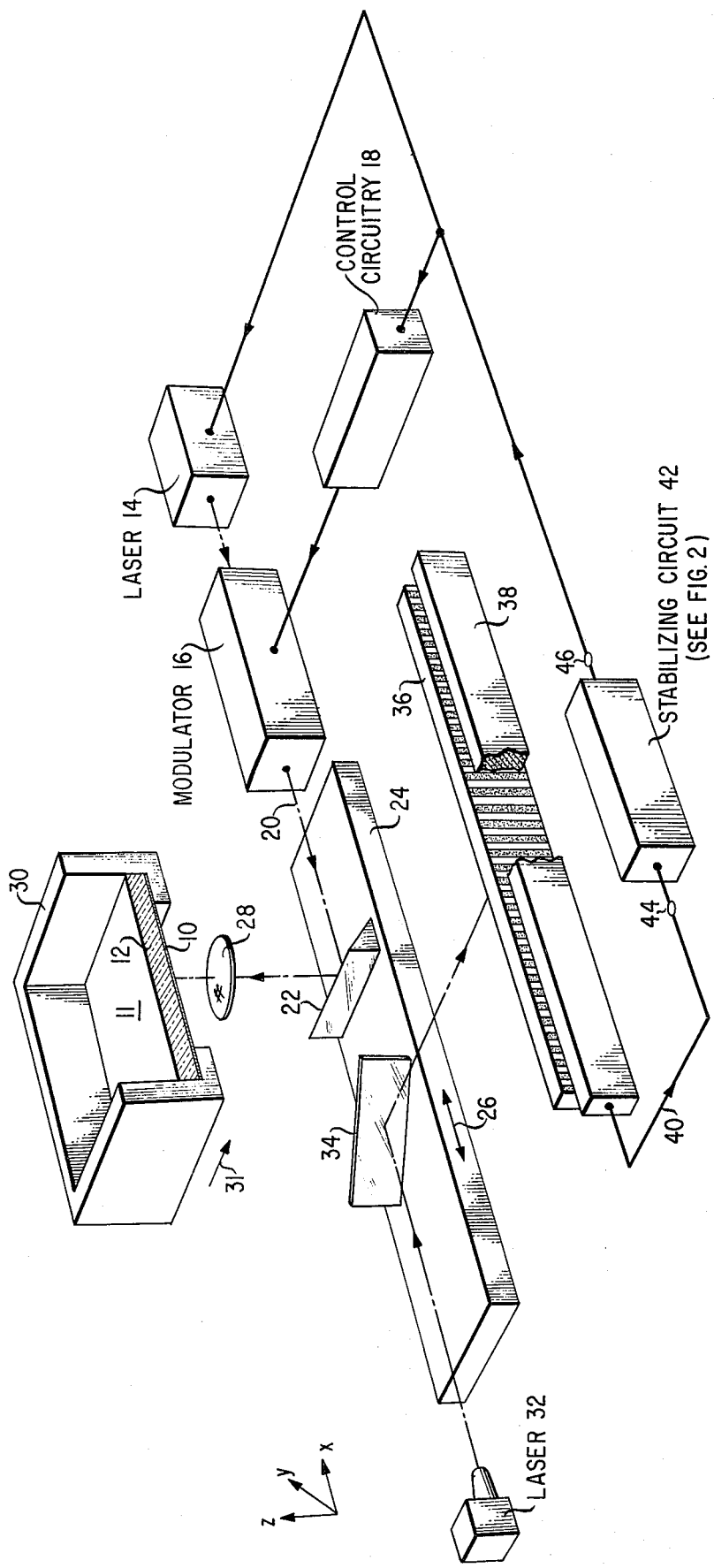
FIG. 1 shows a laser machining system of the type in which a specific illustrative embodiment of the present invention is advantageously included.

The system schematically represented in FIG. 1 is designed to scan a laser beam over the surface of a thin film 10 made, for example, of iron oxide that is deposited on a flat glass substrate 12. The film-substrate member constitutes a reticle blank 11 that is to be machined by the scanning laser beam.

The machining beam is provided by a laser 14 which illustratively is a cavity-dumped Nd:YAG laser pumped by a single krypton arc lamp (not shown) to obtain an average output power of about 2 watts in its $TEM_{00}$ mode. Spaced-apart pulses from the laser 14 are directed to propagate through modulator 16 which, for example, is of the acousto-optic type. Modulating signals are applied to the unit 16 by control circuitry 18 in synchronism with the occurrence of pulses from the laser 14. The modulating signals determine whether or not the respective laser pulses are deflected to impinge on successive spot positions of the thin film 10.

In FIG. 1, laser pulses that are not deflected by the modulator 16 propagate along dashed-line path 20 toward a mirror 20 which is fixedly secured to a conventional shuttle table 24 that is mounted on a linear air bearing. The table 24 reciprocates back and forth in the *x* direction, as indicated by arrow 26. As the table moves, pulses reflected from the mirror 22 are focused by lens 28 to scan an *x*-direction line on the surface of the thin film 10. Each laser pulse that impinges upon the film 10 causes a well-defined area of the film to be removed by evaporation, thereby leaving a transparent spot therein.

The reticle blank 11 of FIG. 1 is mounted in a cassette 30 carried by a conventional stepping table (not shown) that is designed to move the reticle blank 11 in the direction indicated by arrow 31 in a line-by-line manner. More specifically, after each *x*-direction scan of the film 10 by the aforespecified laser pulses, the reticle blank 11 is moved in the *y* direction one line position. In that way the entire surface of the film 10 is selectively machined in a line-by-line way to form a reticle constituting a prescribed pattern of transparent and opaque regions.

To synchronize the occurrence of laser machining pulses in the *x* direction with movement of the table 24, a second laser 32 is included in the FIG. 1 system. The output of the laser 32, which illustratively is a heliumneon one, is directed via a mirror 34 mounted on the table 24 to impinge on a conventional code plate or grating 36. The plate 36 contains, for example, about 5000 5-micron-wide lines that are alternately clear and opaque.

As the table 24 moves in the direction of the arrow 26, the laser beam reflected from the mirror 34 scans the fixed plate 36 in the x direction. Light transmitted through successive clear lines of the plate 36 is detected by a conventional elongated photodiode 38 which provides sequentially occurring electrical timing signals.

Alternatively, a conventional interferometer arrangement may be utilized instead of the code plate 36 to monitor movement of the table 24 and to provide signals for synchronizing the output of the laser 14 with x-direction movement of the table 24.

Whether a code plate, as shown in FIG. 1, or an interferometer is used for synchronizing purposes, it is essential that the electrical signals applied to the laser 14 to control the pulsed operation thereof occur in uniformly spaced-apart time slots. If this is not the case, the output pulses provided by the laser 14 will not be equal in amplitude. The consequence of unequal-amplitude laser pulses is that the fabrication of high-quality reticles by the FIG. 1 system is not possible.

Due primarily to occasional mechanical vibrations of the table 24 of FIG. 1 and to irregularities in the structure of the code plate 36, the electrical timing signals appearing at the output of the photodiode 38 on line 40 are irregular in nature. More specifically, the photodiode 38 provides a train of signals characterized most of the time by a uniform spacing. But from time to time in a random manner the signals so provided deviate from a uniform-spacing characteristic. The application of such an overall signal train directly to the laser 14 would, as described above, lead to unsatisfactory operation of the depicted system.

Therefore, in accordance with the principles of the present invention, a stabilizing circuit 42 is interposed between the line 40 and the input to the laser 14. One main purpose of the circuit 42 is to track that portion of the output of the photodiode 38 characterized by uniform spacing and to be "transparent" to the randomly occurring variations in the photodiode output. In that way the spacing between the timing or control signals applied to the laser 14 by the circuit 42 is made exactly or nearly exactly uniform.

Moreover, in some applications of practical importance it has been found that the physically achievable resolution of the grating formed on the code plate 36 is insufficiently fine to satisfy the resolution desired to be achieved along an x-direction line of the reticle blank 11. Accordingly, another main purpose of the circuit 42 is to provide laser-driving signals whose frequency is a suitably multiplied version of the output of the photodetector 38. These higher-frequency driving signals cause the laser 14 to operate at a correspondingly higher pulse repetition rate. In turn, this means that the resolution capability of the laser beam with respect to the pattern being machined in the thin film 10 is improved.

In addition, the higher laser pulse repetition rate thereby achieved is advantageous in those cases wherein the stable operating frequency range of the laser 14 exceeds the frequency of the signals provided by the photodetector 38. Furthermore, the frequency multiplication characteristic of the circuit 42 provides a basis for establishing the pulse repetition rate of the laser 14 at some multiple of the basic data rate at which signals are applied by the control circuitry 18 to the modulator 16. In that way corresponding locations of multiple lines may be identically machined between successive data signals.

Figure 2:
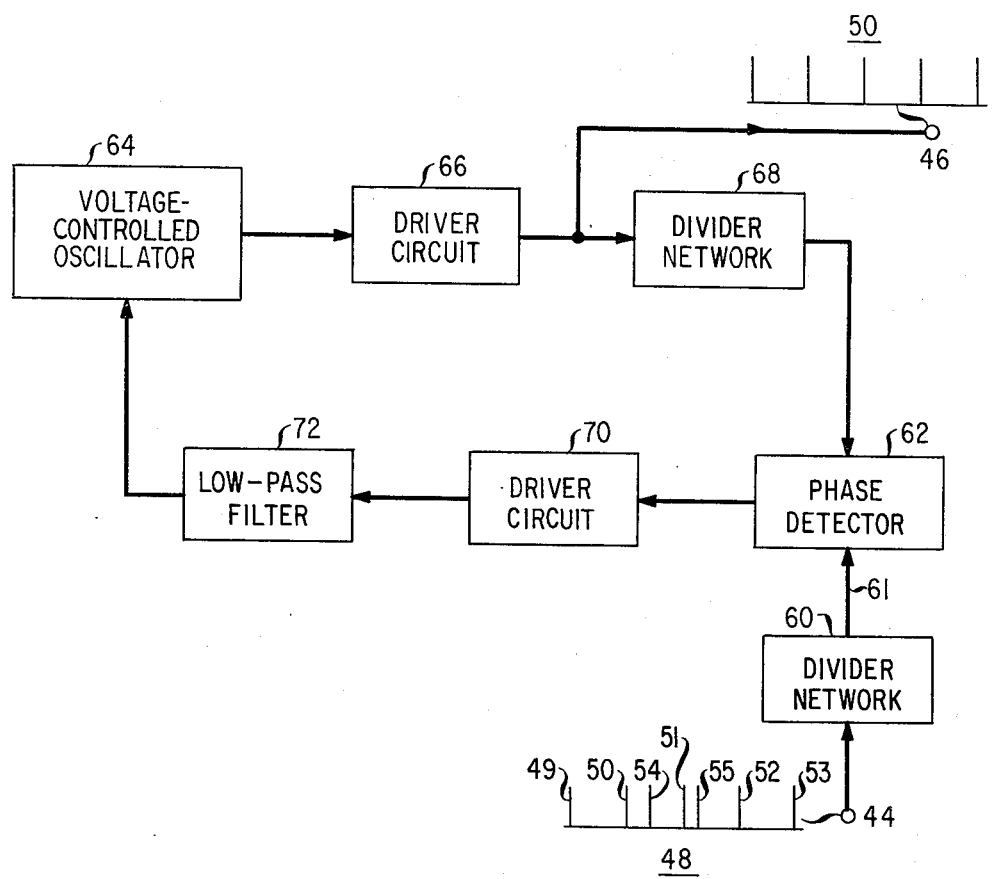
FIG. 2 is a block diagram representation of a specific illustrative arrangement made in accordance with the principles of the invention.

In FIG. 2, input and output terminals 44 and 46 correspond respectively to the terminals shown in FIG. 1 designated with the same reference numerals. Illustratively, input signal train 48 is represented schematically in FIG. 2 as including uniformly spaced-apart portions comprising, for example, signals 49 through 53 and a nonuniformly spaced-apart portion comprising randomly occurring signals 54 and 55.

The arrangement shown in FIG. 2 is a variation of a conventional phase-locked-loop circuit. Modifications have been made to such a standard circuit to impart thereto improved filtering and frequency multiplication characteristics. The individual component blocks of FIG. 2 are themselves conventional and well known to workers skilled in the signal processing art and may assume any of a variety of specific configurations.

Assume by way of a particular example that the regularly occurring signals 49 through 53 applied to the input terminal 44 of FIG. 2 are characterized by a 100-kilohertz rate. Frequency division, for example by a factor of 4, was found to be effective to reduce and in some cases eliminate randomly occurring signals of the type represented by reference numerals 54 and 55. Such division is carried out in network 60 whose output is applied via lead 61 to phase detector 62. Accordingly, the signals applied to the detector 62 on the lead 61 occur at a 25-kilohertz rate.

The other input to the phase detector 62 is derived from a voltage-controlled oscillator 64 which, for example, is designed to operate at a pulse rate of 300 kilohertz. The output of the oscillator 64 is applied via a driver circuit 66 to a divider network 68 which is designed to reduce the 300-kilohertz rate to 25 kilohertz. Accordingly, the signals applied to the outer or upper input of the detector 62 are characterized by the same frequency as those applied thereto from the network 60.

The output of the detector 62 is applied via a driver circuit 70 and a low-pass filter 72 to the oscillator 64. In this way the signals derived from the output of the driver circuit 66 and applied to the output terminal 46 are effectively locked in phase with respect to the input signals applied to terminal 44. This phase-locking capability is important to the proper operation of the laser machining system shown in FIG. 1.

As is evident from the description above, the repetition rate of the signals applied to the output terminal 46 is illustratively 300 kilohertz, which is three times that of the input signals derived from the photodetector 38 (FIG. 1) and applied to the terminal 44 of FIG. 2. By selecting suitable frequencies for the oscillator 64 and corresponding divisors for the network 68 it is apparent that the pulse rate of the signals applied to the output terminal 46 may easily be established to achieve any desired multiple of the 100-kilohertz input rate.

The low-pass filter 72 of FIG. 2, which may comprise, for example, a simple RC network, also serves to provide the depicted circuit with an immunity of response to randomly occurring high-repetition-rate input signals such as the pulses 54 and 55. Such input signal perturbations cause the output of the detector 62 to contain relatively high frequency components that are not passed by the filter 72 to the oscillator 64. In fact, in some applications of practical interest it has been found that the unit 72 provides sufficient filtering so that the divider network 60 may be omitted altogether.

In that case the network 68 has of course to be adjusted to insure that the frequencies of the two input signals applied to the phase detector 62 are the same.

By varying the divisor of the network 68 the rate at which the FIG. 2 circuit responds to frequency changes in the output signal train may also be controlled. Thus adjustment of the network 68 provides another way in which the response of the depicted circuit to randomly occurring "noise" signals is minimized.

Thus the FIG. 2 circuit has the capability of smoothing irregular frequency perturbations that occur in the input pulse train 48. In addition, as described above, the input train may be multiplied in frequency by the depicted circuit by any desired integral factor. Accordingly, the circuit provides at terminal 46 a pulse train 50 that is characterized both by uniform interpulse spacings and, if desired, by a higher repetition rate than that of the input pulse train 48.

Finally, it is to be understood that the above-described arrangements are only illustrative of the application of the principles of the present invention. In accordance with those principles, numerous modifications thereof may be devised by those skilled in the art without departing from the spirit and scope of the invention.

What is claimed is:

1. In combination, a pulse-operated laser, means external to said laser for generating timing signals for driving said laser to control the pulse-mode operation thereof, said timing signals including uniformly spaced-apart signals and randomly occurring nonuniformly spaced-apart signals, and a phase-locked-loop circuit interposed between said generating means and said laser for processing said timing signals to in effect remove the randomly occurring nonuniformly spaced-apart signals therefrom to provide laser driving signals that are uniformly spaced apart and whose frequency is an integral multiple of said uniformly spaced-apart timing signals.

2. A combination as in claim 1 wherein said circuit comprises
   a phase detector for providing an output control signal,
   an oscillator for applying reference signals to one input of said detector, the frequency of said reference signals being an integral multiple of said uniformly spaced-apart timing signals,
   means for applying the timing signals provided by said generating means to a second input of said detector,
   a network interposed between the output of said oscillator and the one input of said detector for dividing the reference signal frequency to cause the signal frequencies applied to the inputs of said detector to be approximately equal,
   means for applying the output control signal of said phase detector to said oscillator for controlling the frequency of said reference signals, and
   means for applying the output of said oscillator at said reference signal frequency to said laser.

3. A combination as in claim 2 further including a low-pass filter interposed between the output of said phase detector and the input of said oscillator for inhibiting the transmission to said oscillator of those control signals provided by said phase detector in response to the occurrence of said randomly occurring nonuniformly spaced-apart timing signals.

4. A combination as in claim 3 further including means for dividing the frequency of the uniformly spaced-apart timing signals provided by said generating means before the timing signals are applied to the second input of said detector, thereby to substantially remove the randomly occurring nonuniformly spaced-apart timing signals from the signals applied to the second input of said detector.

5. A combination as in claim 4 wherein said laser comprises a cavity-dumped Nd:YAG laser.

6. A combination as in claim 5 wherein said generating means external to said laser comprises
   a stationary code plate,
   a reciprocating shuttle table having a mirror mounted thereon,
   a timing-signal laser source positioned to direct its light output at said mirror for reflection therefrom to scan said code plate as said table moves, and
   a photodetector positioned adjacent the code plate to convert light passed by said plate to a series of electrical timing signals.

\* \* \* \* \*